United States Patent
Kim et al.

(10) Patent No.: US 11,631,614 B2
(45) Date of Patent: Apr. 18, 2023

(54) MIM CAPACITOR WITH ADJUSTABLE CAPACITANCE VIA ELECTRONIC FUSES

(71) Applicant: QUALCOMM Incorporated, San Diego, CA (US)

(72) Inventors: Jonghae Kim, San Diego, CA (US); Jin-Su Ko, San Jose, CA (US); Beomsup Kim, Los Altos Hills, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 17/536,464

(22) Filed: Nov. 29, 2021

(65) Prior Publication Data

US 2022/0084883 A1 Mar. 17, 2022

Related U.S. Application Data

(62) Division of application No. 16/820,961, filed on Mar. 17, 2020, now Pat. No. 11,211,290.

(51) Int. Cl.
*H01L 23/522* (2006.01)
*H01L 21/768* (2006.01)
*H01L 49/02* (2006.01)

(52) U.S. Cl.
CPC .... *H01L 21/76891* (2013.01); *H01L 23/5223* (2013.01); *H01L 28/40* (2013.01)

(58) Field of Classification Search
CPC .............. H01L 21/76891; H01L 23/5223; H01L 28/40

USPC .................................................. 257/303, 306
See application file for complete search history.

(56) References Cited

U.S. PATENT DOCUMENTS

| 2006/0145293 | A1* | 7/2006 | Cho | ............. H01L 23/5223 257/532 |
| 2020/0043873 | A1 | 2/2020 | Chang et al. | |
| 2021/0296170 | A1 | 9/2021 | Kim et al. | |

* cited by examiner

*Primary Examiner* — Hoai V Pham
(74) *Attorney, Agent, or Firm* — Muncy, Geissler, Olds and Lowe PC

(57) ABSTRACT

Certain aspects of the present disclosure are generally directed to techniques and apparatus for adjusting capacitance in one or more metal-insulator-metal (MIM) capacitors in an effort to reduce capacitance variation between semiconductor devices and improve yield during fabrication. One example method for fabricating a semiconductor device generally includes measuring a capacitance value of a MIM capacitor of the semiconductor device, determining the measured capacitance value of the MIM capacitor is above a target capacitance value for the MIM capacitor, and selectively rupturing a set of connections in the MIM capacitor based on the measured capacitance value. Selectively rupturing the set of connections in the MIM capacitor may reduce the capacitance value of the MIM capacitor to a value approximately that of the target capacitance value.

7 Claims, 4 Drawing Sheets

MIM CAPACITOR WITH ADJUSTABLE CAPACITANCE VIA ELECTRONIC FUSES

CROSS-REFERENCE TO RELATED APPLICATIONS

This application is a divisional of U.S. application Ser. No. 16/820,961, filed Mar. 17, 2020, which is hereby assigned to the assignee hereof and hereby expressly incorporated by reference herein in its entirety as if fully set forth below and for all applicable purposes.

TECHNICAL FIELD

Certain aspects of the present disclosure generally relate to semiconductor devices and, more particularly, to techniques and apparatus for adjusting capacitance in metal-insulator-metal (MIM) capacitors in an effort to reduce capacitance variation between semiconductor devices and improve yield during fabrication.

BACKGROUND

Capacitors are elements that are used extensively in semiconductor devices for storing an electrical charge. Parallel-plate capacitors essentially comprise two conductive plates separated by an insulator. For a parallel-plate capacitor, the capacitance, or amount of charge held by the capacitor per applied voltage, depends on a number of parameters such as the area of the plates, the distance between the plates, and the dielectric constant (also referred to as the "permittivity") of the insulator between the plates. Capacitors can be used in filters, power supplies, analog-to-digital converters, memory devices, control applications, and many other types of semiconductor devices.

One type of capacitor is a metal-insulator-metal (MIM) capacitor, which is commonly integrated into semiconductor chips and widely used in analog applications (e.g., filters, amplifiers, alternating current (AC) couplers, resistor-capacitor (RC) clamps, etc.). MIM capacitors are also commonly used as decoupling capacitors (decaps) to filter out power network noise. A MIM capacitor includes two terminals (e.g., metal plates), and a dielectric layer between the terminals. Ideally, the capacitance of the MIM capacitor has little to no dependence on the voltage applied to the MIM capacitor.

In a conventional chip, MIM capacitors are typically inserted during back-end-of-line (BEOL) fabrication of the chip, typically at lower metal layers. The BEOL of the chip involves forming multiple metal layers embedded in multiple insulating layers for interconnecting devices in the chip and connecting devices in the chip to contacts for chip-to-package connections.

SUMMARY

Certain aspects of the present disclosure generally relate to techniques and apparatus for adjusting capacitance in a metal-insulator-metal (MIM) capacitor.

Certain aspects of the present disclosure are generally directed to a method for fabricating a semiconductor device. The method generally includes measuring a capacitance value of a MIM capacitor of the semiconductor device, wherein: the MIM capacitor comprises a first metal layer, a first dielectric layer disposed above the first metal layer, and a second metal layer disposed above the first dielectric layer; the second metal layer comprises a primary metal plate and a plurality of secondary metal plates; and the plurality of secondary metal plates are connected between the primary metal plate and a contact electrode via a plurality of connections. The method also generally includes determining the measured capacitance value of the MIM capacitor is above a target capacitance value for the MIM capacitor and selectively rupturing a set of the plurality of connections based on the measured capacitance value.

Certain aspects of the present disclosure generally relate to a semiconductor device. The semiconductor device generally includes a first MIM capacitor, wherein: the first MIM capacitor comprises a first metal layer, a first dielectric layer disposed above the first metal layer, and a second metal layer disposed above the first dielectric layer; the second metal layer comprises a primary metal plate and a plurality of secondary metal plates; the plurality of secondary metal plates are disposed between the primary metal plate and a contact electrode; a first set of the plurality of secondary metal plates are connected to the primary metal plate and the contact electrode via a plurality of connections; and a second set of the plurality of secondary metal plates are disconnected from at least the primary metal plate.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1A:
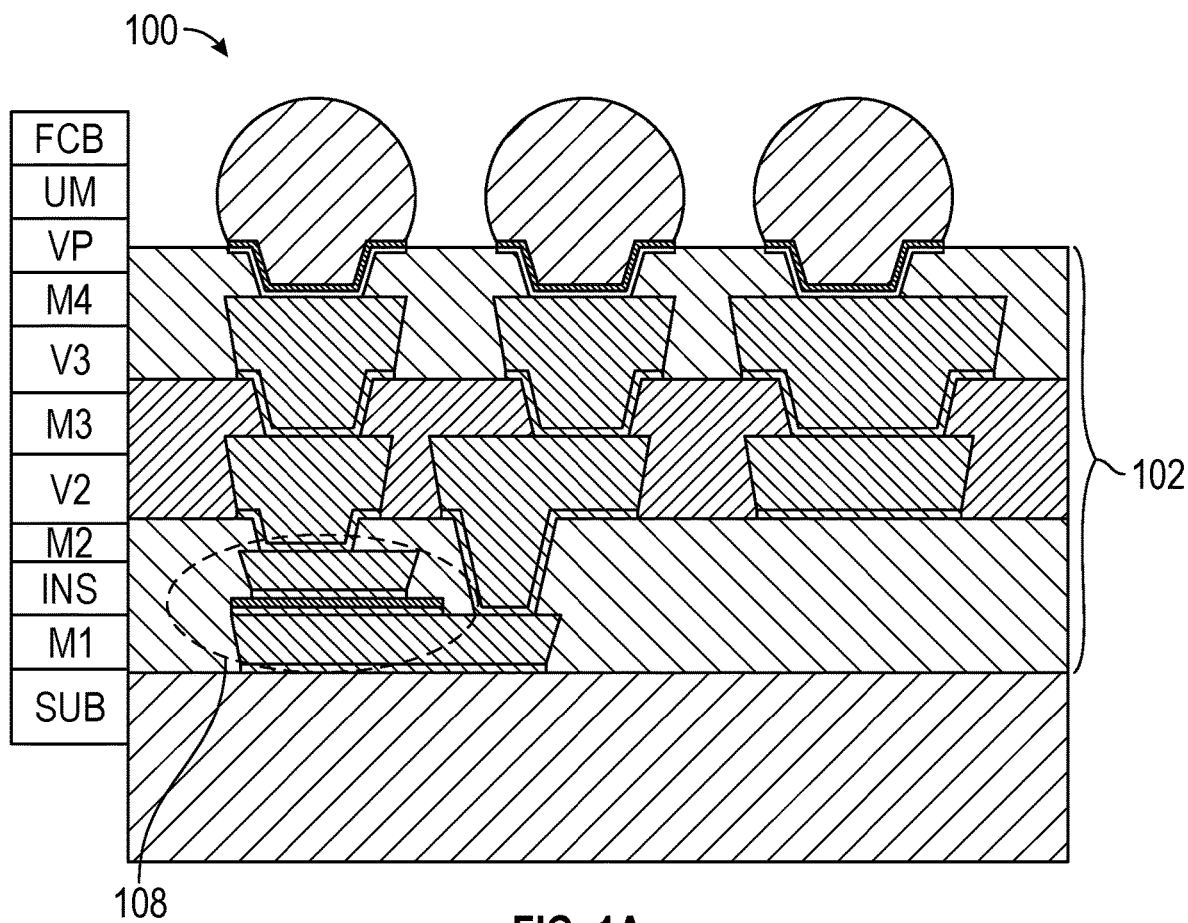
FIG. 1A illustrates a cross-sectional view of a semiconductor device, including a metal-insulator-metal (MIM) capacitor.

Certain aspects of the present disclosure are generally directed to techniques and apparatus for adjusting capacitance in one or more metal-insulator-metal (MIM) capacitors of a semiconductor device in an effort to reduce capacitance variation between different semiconductor devices and improve yield during fabrication. One example method for fabricating a semiconductor device generally includes measuring a capacitance value of a MIM capacitor of the semiconductor device, determining the measured capacitance value of the MIM capacitor is above a target capacitance value for the MIM capacitor, and selectively rupturing a set of connections in the MIM capacitor based on the measured capacitance value. According to aspects, selectively rupturing the set of connections in the MIM capacitor may reduce the capacitance value of the MIM capacitor to approximately the target capacitance value for the MIM capacitor, thereby reducing capacitance variation between MIM capacitors in different semiconductor devices.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Example Semiconductor Device with MIM Capacitor

As noted above, many semiconductor devices may include a number of passive components including capacitors. One type of capacitor that may be implemented in a semiconductor device is a metal-insulator-metal (MIM) capacitor, which are widely used in analog applications (e.g., filters, amplifiers, alternating current (AC) couplers, resistor-capacitor (RC) clamps, etc.). MIM capacitors are also commonly used as decoupling capacitors (decaps) to filter out power network noise.

In a conventional semiconductor chip, MIM capacitors may be inserted during back-end-of-line (BEOL) of the chip. The BEOL of the chip involves forming multiple metal layers embedded in multiple insulating layers to interconnect individual devices, such as transistors, capacitors, resistors, and the like.

FIG. 1A illustrates a cross-sectional view of a semiconductor device 100, including a metal-insulator-metal (MIM) capacitor. As illustrated, the semiconductor device 100 may comprise a plurality of layers 102 formed during BEOL processing. The layers 102 may include a plurality of electrically conductive layers (e.g., the first metal layer (M1), the second metal layer (M2), etc. ordered from lowest to highest) and a plurality of electrically insulative layers (which may be referred to as "dielectric layers" or "via layers," such as the second via layer (V2), the third via layer (V3), etc.). In certain cases, one or more passive devices may be embedded in the layers 102, such as resistors, capacitors, inductors, and the like. For example, as illustrated, the layers 102 may include a MIM capacitor 108. As shown, the MIM capacitor 108 includes two terminals (e.g., metal plates), and insulative layer (labeled "INS," also referred to as a "dielectric layer") between the terminals. As illustrated the two terminals may include metal plates in layers M1 and M2 of the semiconductor device 100.

Figure 1B:
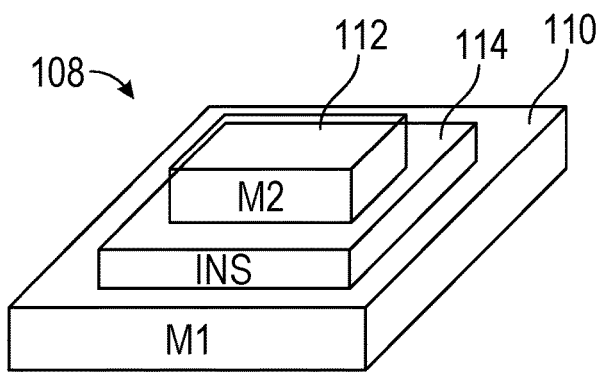
FIG. 1B illustrates the MIM capacitor of the semiconductor device of FIG. 1A.

FIG. 1B illustrates a perspective view of the MIM capacitor 108. As illustrated, the MIM capacitor 108 may include a first metal layer 110, a second metal layer 112, and a first dielectric layer 114 disposed between the first metal layer 110 and the second metal layer 112. Although the metal layers 110, 112 are illustrated as being the M1 and M2 layers, the metal layers 110, 112 may be disposed on other, higher metal layers of a semiconductor device.

The capacitance of an ideal MIM capacitor with equal-sized first and second metal plates may be represented by $$C = \frac{\epsilon S}{t},$$

where ε is the permittivity of the dielectric layer separating the first and second metal layers, S represents the surface area of the either the first or second metal layer (x-dimension*y-dimension), and t represents the thickness of the dielectric layer.

However, during manufacture of a wafer with several semiconductor devices including one or more MIM capacitors (e.g., MIM capacitor 108), the dimensions of one or more of the first metal layer 110, the second metal layer 112, or the thickness of the first dielectric layer 114 may vary, leading to a variation in capacitance for the different devices or for different MIM capacitors within a device. This variation in capacitance may be represented by $$\Delta C = \frac{\epsilon \cdot \Delta X \cdot \Delta Y}{\Delta t},$$

where ΔX represents a difference in the x-dimension of the first metal layer or the second metal layer, ΔY represents a difference in the y-dimension of the first metal layer or the second metal layer, and Δt represents a difference in the thickness of the dielectric layer. For example, in some cases, the MIM capacitor 108 may have a different capacitance value as compared to another MIM capacitor in the semiconductor device 100, for example, due to the first metal layer 110, the second metal layer 112 and the first dielectric layer 114 of the MIM capacitor 108 having different dimensions as compared to the first metal layer 110, the second metal layer 112 and the first dielectric layer 114 of the other MIM capacitor. This variation in capacitance is undesirable and may lead to devices incorporating such MIM capacitors to function improperly or to fail manufacturing tests and be deemed defective devices.

Example MIM Capacitor with Electronic Fuses

Aspects of the present disclosure provide techniques for adjusting the capacitance in one or more MIM capacitors of a semiconductor device in an effort to reduce capacitance variation between semiconductor devices and improve yield during fabrication. For example, techniques presented herein for adjusting the capacitance in one or more MIM capacitors of the semiconductor device may involve selectively rupturing a set of connections within the one or more MIM capacitors to fine-tune a capacitance value of the one or more MIM capacitors, thereby reducing capacitance variation of the MIM capacitors between devices.

Figure 2A:
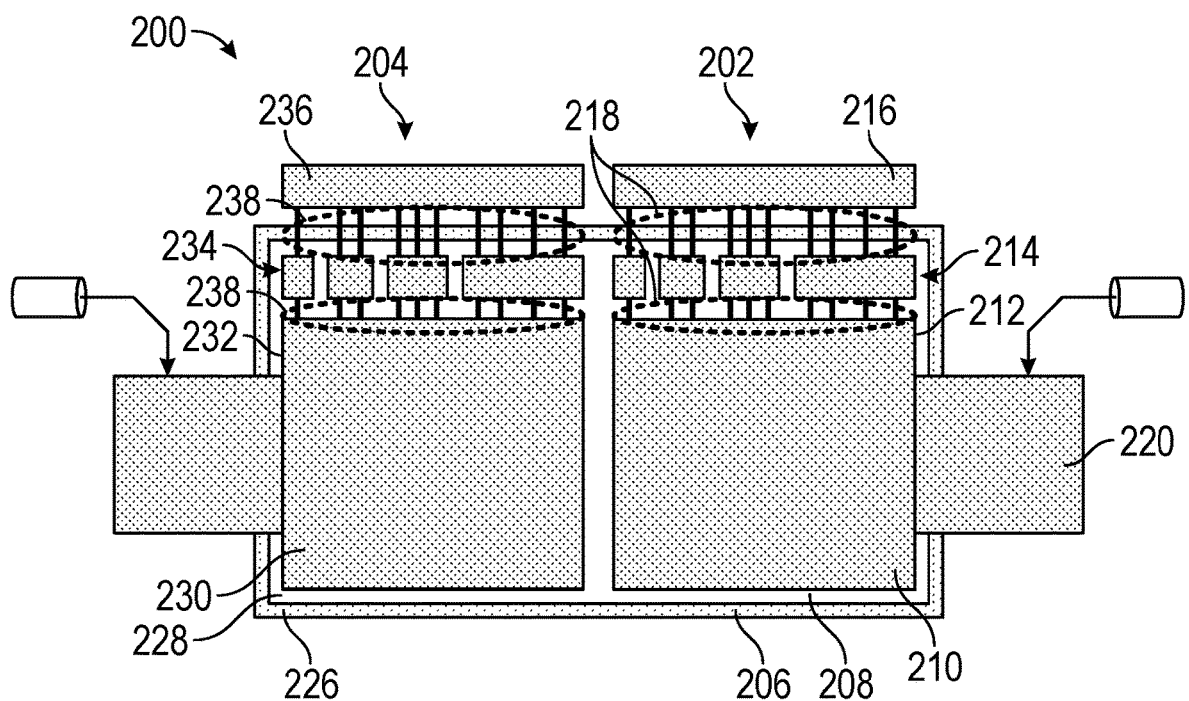
FIGS. 2A and 2B illustrate a cross-sectional view of a MIM capacitor with multiple parallel tuning capacitors with selectively rupturable connections and an equivalent circuit diagram, respectively, in accordance with certain aspects of the present disclosure.

For example, FIG. 2A illustrates a semiconductor device 200 comprising a first MIM capacitor 202 and a second MIM capacitor 204. As illustrated, the first MIM capacitor 202 comprises a first metal layer 206, a first dielectric layer 208 disposed above the first metal layer 206, and a second metal layer 210 disposed above the first dielectric layer 208.

Further, as illustrated, the second metal layer 210 of the first MIM capacitor 202 comprises a primary metal plate 212 and a plurality of secondary metal plates 214. The plurality of secondary metal plates 214 is disposed between the primary metal plate 212 and a first contact electrode 216. Although the first contact electrode 216 is depicted in FIG. 2A as being disposed in the second metal layer 210, the first contact electrode may be alternatively be located on other layers. The plurality of secondary metal plates 214 may be connected to the primary metal plate 212 and the first contact electrode 216 via a plurality of connections 218. In some cases, the plurality of connections 218 may function as an electronic fuse (e-fuse). According to aspects, the primary metal plate 212 may be coupled with a second contact electrode 220. In some cases, the first contact electrode 216 may be disposed in the second metal layer 210 and may be disposed adjacent to the plurality of secondary metal plates 214.

According to aspects, the first MIM capacitor 202 may be associated with a particular target capacitance value, which may be based on ideal dimensions of the first metal layer 206, the first dielectric layer 208, and the second metal layer 210. However, as noted above, in some cases, the dimensions of one or more of the first metal layer 206, the first dielectric layer 208, and the second metal layer 210 may vary from nominal dimensions during the fabrication process, which may lead to a capacitance value of the first MIM capacitor 202 exceeding the target capacitance value for the first MIM capacitor 202.

For certain aspects, each secondary metal plate of the plurality of secondary metal plates 214 may be associated with a unique capacitance value, which, as noted above, may be based on the dimensions (e.g., area) of the secondary metal plate. Stated otherwise, each secondary metal plate of the plurality of secondary metal plates 214 of the first MIM capacitor 202 may have a different unique area such that each secondary metal plate of the plurality of secondary metal plates 214 is associated with a different unique capacitance value. For other aspects, at least two of the secondary metal plates 214 may have the same area (and hence, the same or similar capacitance). Similarly, the primary metal plate 212 may also be associated with a unique capacitance value, different from the capacitance value associated with any of the secondary metal plates 214. Accordingly, each of the secondary metal plates of the plurality of secondary metal plates 214 as well as the primary metal plate 212 may be represented as an individual capacitor connected in parallel. Although four secondary metal plates 214 are illustrated in FIG. 2A, it is to be understood that the MIM capacitor may include more or less than four secondary metal plates.

The structure of the second MIM capacitor 204 may be the same or similar to the structure of the first MIM capacitor 202. For example, the semiconductor device 200 may include another MIM capacitor, such as the second MIM capacitor 204, comprising a third metal layer 226, a second dielectric layer 228 disposed above the third metal layer 226, and a fourth metal layer 230 disposed above the second dielectric layer 228. In some cases, the third metal layer 226, the second dielectric layer 228, and the fourth metal layer 230 may be the same as the first metal layer 206, the first dielectric layer 208, and the second metal layer 210, respectively, and as illustrated in FIG. 2A. Similarly, the fourth metal layer 230 may comprise another primary metal plate 232 and another plurality of secondary metal plates 234. Additionally, the other plurality of secondary metal plates 234 may be connected between the other primary metal plate 232 and another contact electrode 236 via another plurality of connections 238.

Figure 2B:
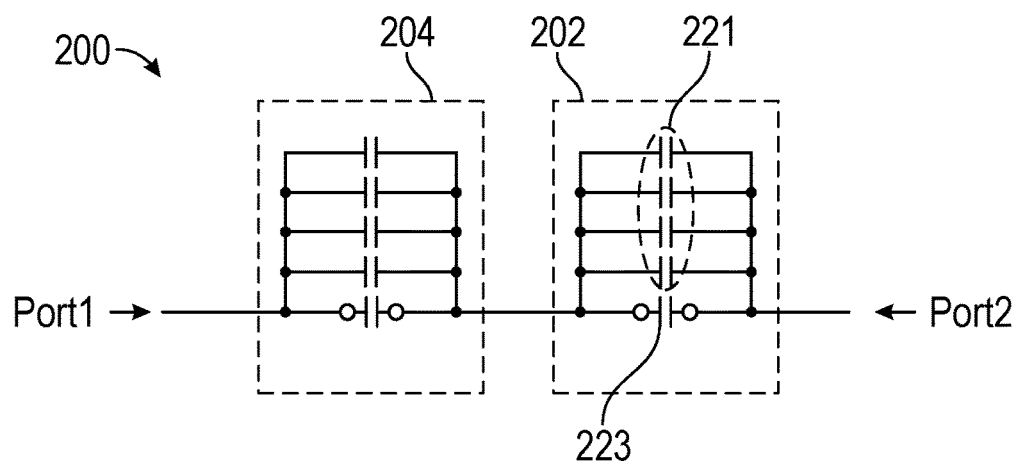

FIG. 2B illustrates an equivalent circuit diagram corresponding to the first MIM capacitor 202 and the second MIM capacitor 204 of the semiconductor device 200. As illustrated, the first MIM capacitor 202 and the second MIM capacitor 204 may each be represented by a plurality of capacitors coupled in parallel. For example, as shown, the capacitors formed between the first metal layer 206 and the plurality of secondary metal plates 214 may be represented by the plurality of capacitors 221, and the capacitor formed between the first metal layer 206 and the primary metal plate 212 may be represented by the capacitor 223, all of which may be coupled in parallel. Further, as shown the first MIM capacitor 202 and the second MIM capacitor 204 may be coupled in series.

Figure 3A:
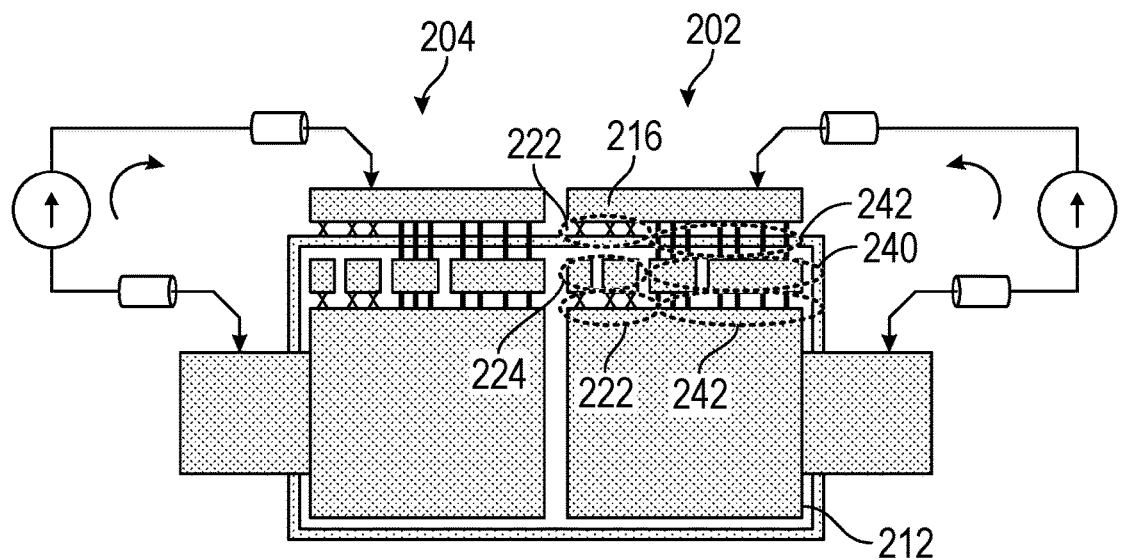
FIGS. 3A and 3B illustrate example operations for determining a current to selectively rupture a set of connections in the MIM capacitor of FIG. 2A, in accordance with certain aspects of the present disclosure.

When a capacitance value of the first MIM capacitor 202 exceeds a target threshold value for the first MIM capacitor 202, a first set of the plurality of connections 222 may be selectively ruptured, thereby effectively removing a set of the plurality of secondary metal plates 214 (as well as their associated individual capacitance values) from the circuitry of the first MIM capacitor 202, as shown in FIG. 3A. Accordingly, by removing the set of the plurality of secondary metal plates 214 from the circuitry of the first MIM capacitor 202, the capacitance value associated with the first MIM capacitor 202 may be reduced. Thus, by selectively rupturing the first set of the plurality of connections 222, the capacitance value of the first MIM capacitor 202 may be fine-tuned to meet the target capacitance value for the first MIM capacitor 202 and reduce capacitance variation.

According to aspects, which, and how many, of the plurality of connections 218 to selectively rupture may be based, at least in part, on a measured capacitance value of the first MIM capacitor 202 and a target capacitance value for the first MIM capacitor 202. For example, as illustrated in FIG. 3A, a capacitance value of the first MIM capacitor 202 may be measured by a semiconductor processing facility, for example, by applying a varying current between the second contact electrode 220 and the first metal layer 206 of the first MIM capacitor 202 and measuring the capacitance value based on the applied current. A similar technique may be applied to the second MIM capacitor 204 to measure the capacitance value of the second MIM capacitor 204.

Thereafter, the semiconductor processing facility may determine that the measured capacitance value of the first MIM capacitor 202 is above a target capacitance value for the first MIM capacitor 202. In this case, when the measured capacitance value of the first MIM capacitor 202 is above the target capacitance threshold for the first MIM capacitor 202, the semiconductor processing facility may then determine which/how many connections of the plurality of connections 218 (and consequently which/how many secondary metal plates of the plurality of secondary metal plates 214) to remove (e.g., rupture) from the circuitry of the first MIM capacitor 202 such that the capacitance value of the first MIM capacitor 202 is decreased to a value that is approximately the target capacitance value associated with the first MIM capacitor 202 (e.g., within some tolerance threshold of the target capacitance value).

For example, in some cases, determining which/how many connections to rupture may include determining a difference between the measured capacitance value and the target capacitance value of the first MIM capacitor 202. Thereafter, the semiconductor processing facility may determine a first set of secondary metal plates 224 (e.g., as illustrated in FIG. 3A) whose cumulative individual capacitance values is approximately equal to the difference between the measured capacitance value and the target capacitance value of the first MIM capacitor 202.

The semiconductor processing facility may then selectively rupture the first set of the plurality of connections 222 corresponding to the first set of secondary metal plates 224, for example, based on the measured capacitance value, as illustrated in FIG. 3A. Accordingly, as illustrated, after selectively rupturing the first set of the plurality of connections 222, the first MIM capacitor 202 may include the first set of secondary metal plates 224 having the first set of the plurality of connections 222 that are ruptured, as well as a second set of secondary metal plates 240 coupled between the primary metal plate 212 and the first contact electrode 216 via a second set of the plurality of connections 242.

By selectively removing (e.g., rupturing) the first set of the plurality of connections 222 corresponding to the first set of secondary metal plates 224, the capacitance corresponding to the first set of secondary metal plates 224 may be removed from the first MIM capacitor 202, lowering the capacitance value of the first MIM capacitor 202 to be approximately the target capacitance value of the first MIM capacitor 202 (e.g., within a tolerance threshold of the target capacitance value).

According to aspects, selectively rupturing the first set of the plurality of connections 222 may include determining a current level to apply between the primary metal plate 212 and the first contact electrode 216 to selectively rupture the first set of the plurality of connections 222. According to aspects, the semiconductor processing facility may determine the current level based on the difference between the measured capacitance value and the target capacitance value for the MIM capacitor. In other words, the current level may be determined such that the current level is high enough to selectively rupture the set of the first plurality of connections 222 corresponding to the first set of secondary metal plates 224, which may be based on the difference between the measured capacitance value and the target capacitance value for the MIM capacitor.

Figure 3B:
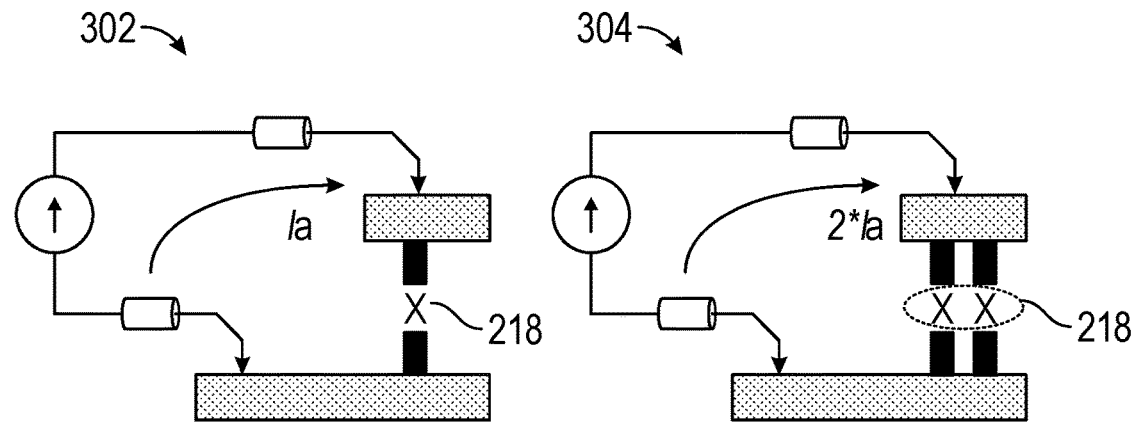

In some cases, the current level may be proportional to a number of connections in the first set of the plurality of connections 222 that will be selectively ruptured. For example, as illustrated in FIG. 3B at 302, a first current level Ia may be used to selectively rupture a single connection of the plurality of connections 218, while, as illustrated at 304, a second current level 2*Ia may be used to selectively rupture two connections of the plurality of connections 218. Accordingly, the larger the number of the set of the plurality connections 222 is, the larger the current level will be to selectively rupture the set of the plurality connections 222. After determining the current level, the semiconductor processing facility may then selectively rupture the first set of the plurality of connections 222, as described above.

While the techniques presented above are described in relation to the first MIM capacitor 202, similar techniques may be applied to the second MIM capacitor 204, as well. Accordingly, the semiconductor processing facility may measure a capacitance value of the second MIM capacitor 204, determine the measured capacitance value of the second MIM capacitor 204 is above a target capacitance value for the second MIM capacitor, and selectively rupture a set of the other plurality of connections of the second MIM capacitor 204. According to aspects, the techniques for measuring, determining, and selectively rupturing may be the same as those techniques described in relation to the first MIM capacitor 202.

Figure 3C:
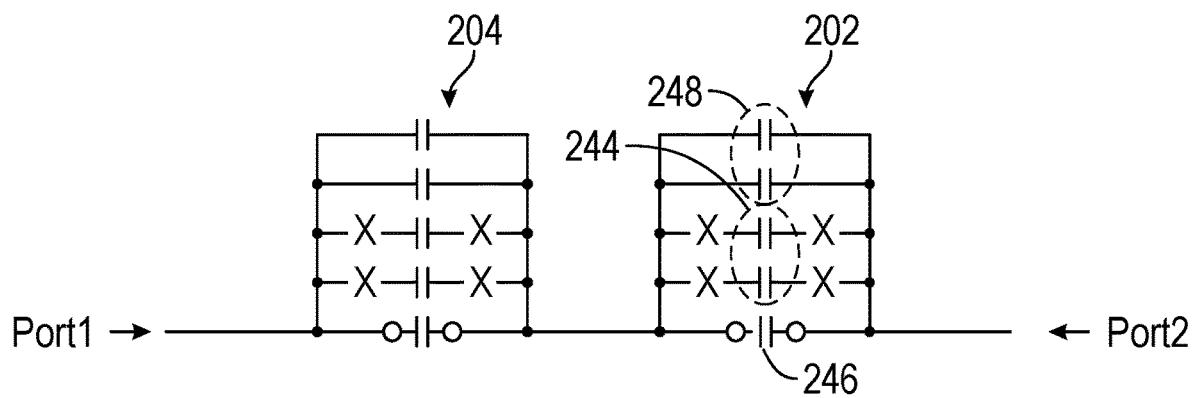
FIG. 3C illustrates an equivalent circuit diagram of the MIM capacitor of FIG. 3A, in accordance with certain aspects of the present disclosure.

FIG. 3C illustrates an equivalent circuit diagram corresponding to the semiconductor device 200 illustrated in FIG. 3A. As illustrated, the first MIM capacitor 202 may be coupled in series with the second MIM capacitor 204. Further, as shown, each of the first MIM capacitor 202 and the second MIM capacitor 204 may be represented by a plurality of capacitors coupled in parallel.

For example, as shown, the first set of the plurality of secondary metal plates 224 disconnected in the first MIM capacitor 202 may be represented by a first set of capacitors 244. Additionally, as shown, the first set of capacitors 244 may not be connected in the first MIM capacitor 202.

Further, as shown, the primary metal plate 212 of the first MIM capacitor 202 may be represented by capacitor 246. Additionally, as shown, the second set of the plurality of secondary metal plates 240 may be represented by a second set of capacitors 248. As shown, the capacitor 246 and the second set of capacitors 248 may be coupled together in parallel in the first MIM capacitor 202.

Figure 4:
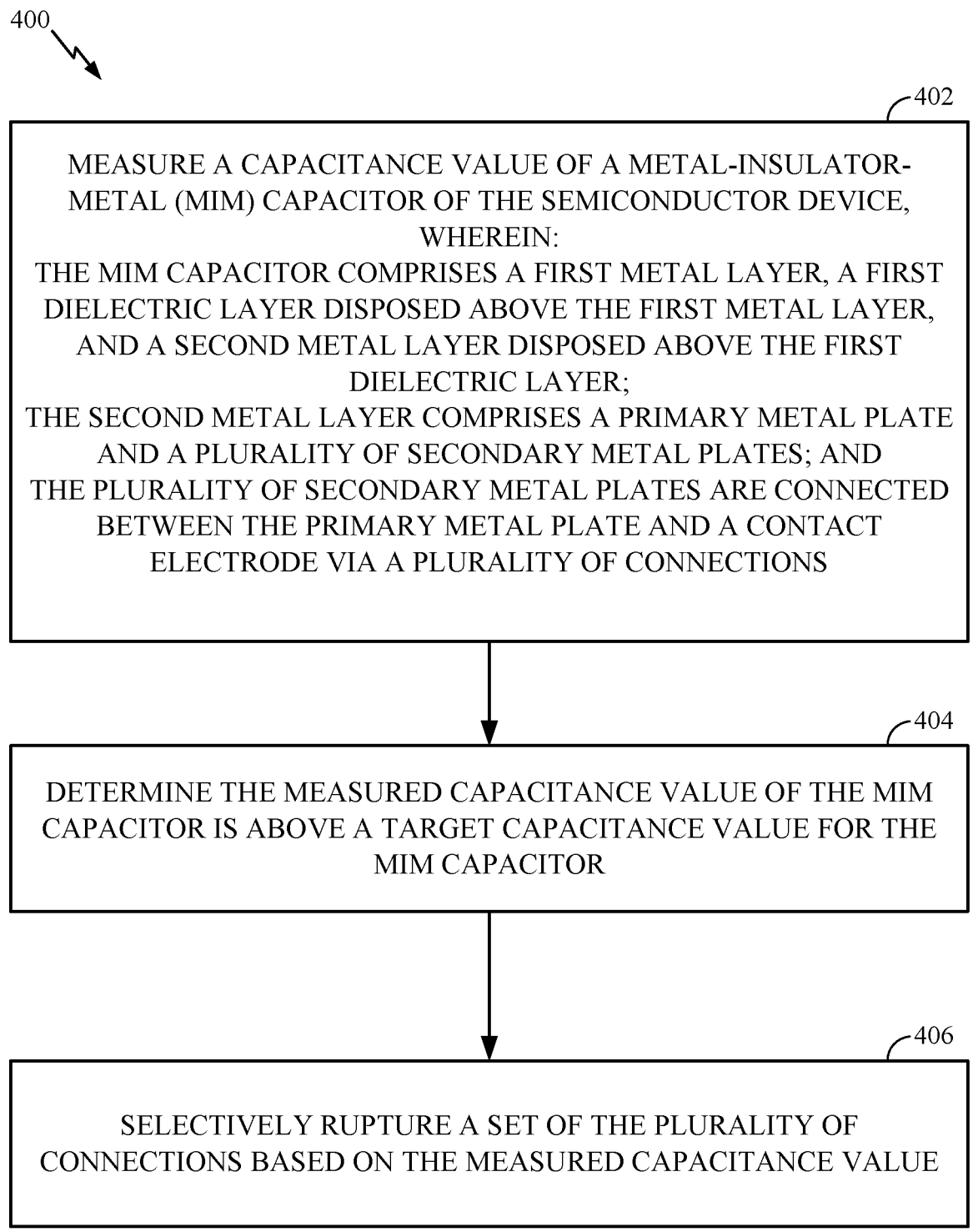
FIG. 4 illustrates example operations for fabricating a semiconductor device, in accordance with certain aspects of the present disclosure.

FIG. 4 illustrates example operations 400 for fabricating a semiconductor device including one or more MIM capacitors, in accordance with certain aspects of the present disclosure. The operations 400 may be performed, for example, by a semiconductor processing facility (e.g., a foundry).

The operations 400 begin, at block 402, with the semiconductor processing facility measuring a capacitance value of a MIM capacitor (e.g., 202) of the semiconductor device. In some cases, the MIM capacitor comprises a first metal layer (e.g., 206), a first dielectric layer (e.g., 208) disposed above the first metal layer, and a second metal layer (e.g., 210) disposed above the first dielectric layer. Additionally, in some cases, the second metal layer comprises a primary metal plate (e.g., 212) and a plurality of secondary metal plates (e.g., 214). Additionally, in some cases, the plurality of secondary metal plates are connected between the primary metal plate and a contact electrode (e.g., 216) via a plurality of connections (e.g., 218). In some cases, the contact electrode may be disposed in the second metal layer and may be adjacent to the plurality of secondary metal plates. For certain aspects, the measuring at block 402 may be performed with one or more test probes.

At block 404, the semiconductor processing facility determines the measured capacitance value of the MIM capacitor is above a target capacitance value for the MIM capacitor.

At block 406, the semiconductor processing facility selectively ruptures a set of the plurality of connections (e.g., 222) based on the measured capacitance value.

In some cases, operations 400 may further include determining a current level to selectively rupture the set of the plurality of connections based on a difference between the measured capacitance value and the target capacitance value for the MIM capacitor. In this case, the set of the plurality of connections may be selectively ruptured at block 406 by applying the determined current level between the primary metal plate and the contact electrode.

Additionally, in some cases, selectively rupturing the set of the plurality of connections at block 406 decreases the capacitance value of the MIM capacitor to a value that is approximately the target capacitance value.

Additionally, in some cases, each secondary metal plate of the plurality of secondary metal plates of the MIM capacitor has a different unique area such that each secondary metal plate of the plurality of secondary metal plates is associated with a different unique capacitance value.

Additionally, in some cases, the semiconductor device further includes another MIM capacitor (e.g., 204). In some cases, the other MIM capacitor may be coupled in series with the MIM capacitor (e.g., 202). Additionally, in some cases, the other MIM capacitor may comprise a third metal layer (e.g., 226), a second dielectric layer (e.g., 228) disposed above the third metal layer, and a fourth metal layer (e.g., 230) disposed above the second dielectric layer. In some cases, the fourth metal layer comprises another primary metal plate (e.g., 232) and another plurality of secondary metal plates (e.g., 234). Additionally, in some cases, the other plurality of secondary metal plates are connected between the other primary metal plate and another contact electrode (e.g., 236) via another plurality of connections. For certain aspects, the third metal layer is the same as the first metal layer, the second dielectric layer is the same as the first dielectric layer, and the fourth metal layer is the same as the second metal layer.

Further, in some cases, operations 400 may further include measuring a capacitance value of the other MIM capacitor, determining the measured capacitance value of the other MIM capacitor is above a target capacitance value for the other MIM capacitor, and selectively rupturing a set of the other plurality of connections.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A semiconductor device comprising a first metal-insulator-metal (MIM) capacitor, wherein:
    the first MIM capacitor comprises a first metal layer, a first dielectric layer disposed above the first metal layer, and a second metal layer disposed above the first dielectric layer;
    the second metal layer comprises a primary metal plate and a plurality of secondary metal plates;
    the plurality of secondary metal plates are disposed between the primary metal plate and a contact electrode;
    a first set of the plurality of secondary metal plates are connected to the primary metal plate and the contact electrode via a plurality of connections; and
    a second set of the plurality of secondary metal plates are disconnected from at least the primary metal plate.

2. The semiconductor device of claim 1, further comprising a second MIM capacitor, wherein:
    the second MIM capacitor comprises a third metal layer, a second dielectric layer disposed above the third metal layer, and a fourth metal layer disposed above the second dielectric layer;
    the fourth metal layer comprises another primary metal plate and another plurality of secondary metal plates;
    the other plurality of secondary metal plates are disposed between the other primary metal plate and another contact electrode;

a third set of the other plurality of secondary metal plates are connected to the other primary metal plate and the other contact electrode via another plurality of connections; and a fourth set of the other plurality of secondary metal plates are disconnected from at least the other primary metal plate.

3. The semiconductor device of claim 2, wherein the second MIM capacitor is coupled in series with the first MIM capacitor.

4. The semiconductor device of claim 2, wherein the third metal layer is the same as the first metal layer, the second dielectric layer is the same as the first dielectric layer, and the fourth metal layer is the same as the second metal layer.

5. The semiconductor device of claim 2, wherein the other contact electrode is disposed in the fourth metal layer and wherein the other contact electrode is disposed adjacent to the other plurality of secondary metal plates.

6. The semiconductor device of claim 1, wherein the contact electrode is disposed in the second metal layer and wherein the contact electrode is disposed adjacent to the plurality of secondary metal plates.

7. The semiconductor device of claim 1, wherein each secondary metal plate of the plurality of secondary metal plates of the first MIM capacitor has a different unique area such that each secondary metal plate of the plurality of secondary metal plates is associated with a different unique capacitance value.

\* \* \* \* \*